(12) United States Patent
Kim et al.

(10) Patent No.: US 12,341,027 B2
(45) Date of Patent: Jun. 24, 2025

(54) TREATING VESSEL AND LIQUID PROCESSING APPARATUS

(71) Applicant: SEMES CO., LTD., Cheonan-si (KR)

(72) Inventors: Dae Sung Kim, Suwon-si (KR); Sang Eun Noh, Pohang-si (KR); Ho Jin Jang, Cheonan-si (KR); Jae Hoon Park, Gwangju-si (KR)

(73) Assignee: Semes Co., Ltd., Chungcheongnam-do (KR)

( * ) Notice: Subject to any disclaimer, the term of this patent is extended or adjusted under 35 U.S.C. 154(b) by 0 days.

(21) Appl. No.: 17/486,060

(22) Filed: Sep. 27, 2021

(65) Prior Publication Data

US 2022/0102169 A1 Mar. 31, 2022

(30) Foreign Application Priority Data

Sep. 29, 2020 (KR) .................. 10-2020-0126540

(51) Int. Cl.
*H01L 21/67* (2006.01)
*H01L 21/02* (2006.01)
(Continued)

(52) U.S. Cl.
CPC .. *H01L 21/67051* (2013.01); *H01L 21/02052* (2013.01); *H01L 21/6732* (2013.01); *H01L 21/68764* (2013.01)

(58) Field of Classification Search
CPC ......... H01L 21/67051; H01L 21/02052; H01L 21/6732; H01L 21/68764; H01L 21/6715;
(Continued)

(56) References Cited

U.S. PATENT DOCUMENTS

2014/0014134 A1* 1/2014 Ogata ................. B08B 13/00
134/104.1
2014/0182631 A1* 7/2014 Namba ............ H01L 21/67051
15/268

(Continued)

FOREIGN PATENT DOCUMENTS

JP 2017059809 A * 3/2017 ............... B08B 3/02
KR 101736441 B1 5/2017
(Continued)

OTHER PUBLICATIONS

KR-20180079593-A (Year: 2018).*
(Continued)

*Primary Examiner* — Alexander Markoff
(74) *Attorney, Agent, or Firm* — Harness, Dickey & Pierce, P.L.C.

(57) ABSTRACT

The inventive concept provides a substrate treating apparatus. The substrate treating apparatus comprising: a treating vessel including an outer cup and an inner cup placed in an inner side of the outer cup, the inner cup and the outer cup in combination defining a recollecting route for a recollecting a liquid; a rotatable spin head placed within the treating vessel on which a cleaning jig is placed; wherein the treating vessel comprises a first protrusion protruding from an inner side surface of the outer cup to direct a cleaning liquid scattering from the cleaning jig toward a surface of the inner cup.

8 Claims, 8 Drawing Sheets

(51) Int. Cl.
*H01L 21/673* (2006.01)
*H01L 21/687* (2006.01)

(58) Field of Classification Search
CPC ......... H01L 21/67178; H01L 21/67184; B08B
3/04; G03F 7/162; G03F 7/70925
See application file for complete search history.

(56) References Cited

U.S. PATENT DOCUMENTS

| | | | | |
|---|---|---|---|---|
| 2014/0261163 | A1* | 9/2014 | Kishita | H01L 21/68714 118/52 |
| 2017/0084470 | A1* | 3/2017 | Suzuki | F26B 3/04 |
| 2017/0361364 | A1* | 12/2017 | Ogata | B08B 13/00 |
| 2022/0075280 | A1* | 3/2022 | Eum | H01L 21/67178 |

FOREIGN PATENT DOCUMENTS

| | | | |
|---|---|---|---|
| KR | 20180079593 A * | 7/2018 | |
| KR | 101958639 B1 | 3/2019 | |
| KR | 10-2019-0056904 A | 5/2019 | |
| KR | 101977752 B1 * | 8/2019 | |
| WO | WO-2015029563 A1 * | 3/2015 | ....... H01L 21/67051 |

OTHER PUBLICATIONS

WO-2015029563-A1 (Year: 2015).*
JP-2017059809-A (Year: 2017).*
KR-101977752-B1 (Year: 2019).*
KR 10-1689619 (Year: 2016).*
KR 10-1736441 (Year: 2017).*

* cited by examiner

TREATING VESSEL AND LIQUID PROCESSING APPARATUS

CROSS-REFERENCE TO RELATED COATINGS

A claim for priority under 35 U.S.C. § 119 is made to Korean Patent Application No. 10-2020-0126540 filed on Sep. 29, 2020, in the Korean Intellectual Property Office, the entire contents of which are hereby incorporated by reference.

BACKGROUND

Embodiments of the inventive concept described herein relate to a substrate treating apparatus and more specifically, a substrate treating apparatus that can clean a cup provided at a liquid processing unit.

To manufacture a semiconductor device, various processes must be performed such as cleaning, vapor deposition, photolithography, etching, ion implantation, etc. Among these the process of photolithography proceeds in the consecutive stages of coating, exposing, and developing. The coating process is a procedure of applying a coating solution such as photoresist on the surface of the substrate. The exposing process is a procedure of exposing the photoresist on the substrate using a photomask. The developing process is a procedure of selectively removing the exposed photoresist from the substrate.

Generally the coating process and the developing process are processes of supplying a treatment liquid on the substrate and treating the substrate with the processing liquid. The liquid processing on the substrate is performed in the treating vessel and these used processing liquids are recollected through the treating vessel.

Processing liquids stain the treating vessel because various processing liquids are recollected into the treating vessel according to each process. The processing liquids staining the treating vessels act as a fume, or become a major cause of substrate contamination.

Figure 1A:
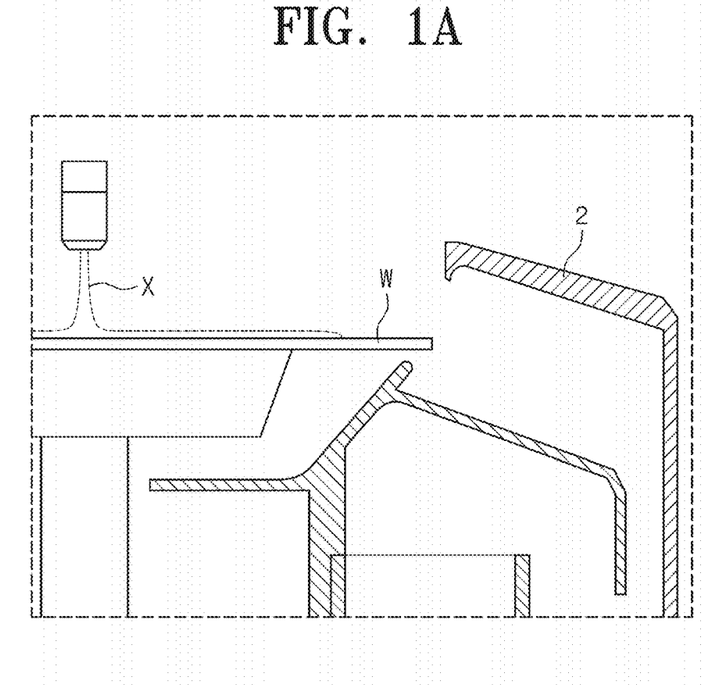
FIG. 1A is a cross sectional view illustrating a general liquid processing apparatus used in a coating process.

FIG. 1A is a cross-sectional view illustrating a general liquid processing apparatus used in a coating process. Referring to FIG. 1A, in the liquid processing apparatus, a substrate W is placed in a treating vessel 2, and a photosensitive solution X is supplied onto the substrate W. The photosensitive solution X is a viscous liquid and is attached to the recollecting path in large quantities. The photosensitive solutions X attached to the recollecting path of the treating vessel 2 may contaminate peripheral apparatus and adversely affect the operator.

According to this, the treating vessel in which the photosensitive solutions X remain requires periodic cleaning.

Figure 1B:
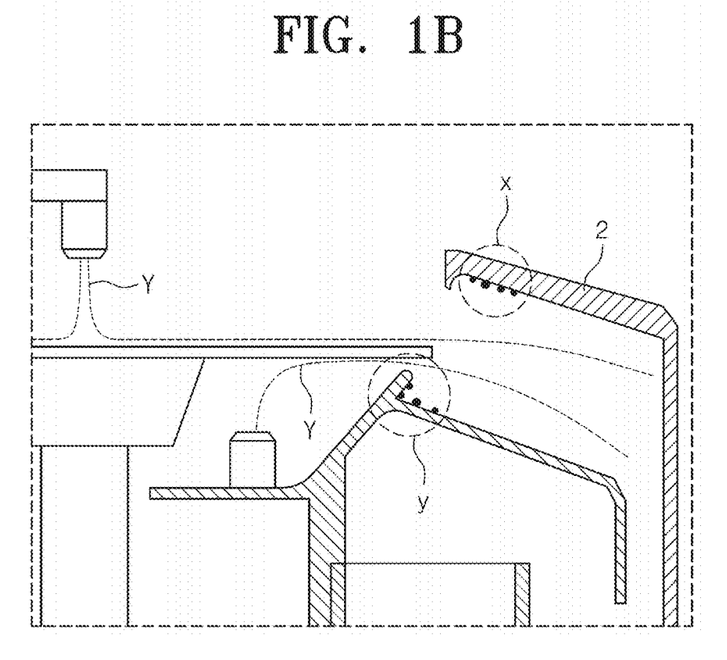
FIG. 1B is a cross sectional view illustrating a process of cleaning a treating vessel of the apparatus of FIG. 1.

FIG. 1B is a cross-sectional view illustrating a process of cleaning and processing a processing container in the device of FIG. 1A. Referring to FIG. 1B, the cleaning process of the treating vessel 2 may be performed before or after the liquid application of the substrate W is completed. When the cleaning process of the treating vessel 2 is performed, a cleaning liquid Y is supplied from above and below the cleaning jig toward the cleaning jig. The cleaning liquid Y is scattered from the cleaning jig and recollected through a recollecting path, and the residual photosensitive liquid is cleaned.

However, the cleaning liquid Y does not reach some of the regions x,y of the treating vessel 2 forming the recollecting path. For example, the lower region y facing the substrate W in the treating vessel 2 and the upper regions x higher than the substrate W correspond to the non-reach region of the cleaning liquid Y. Accordingly, even though the cleaning process is completed, photosensitive solution X may still remain on the treating vessel 2, and it is very difficult to clean it.

SUMMARY

Embodiments of the inventive concept provide a treating vessel having easiness in cleaning a remaining processing liquid and a substrate treating apparatus.

The technical objectives of the inventive concept are not limited to the above-mentioned ones, and the other unmentioned technical objects will become apparent to those skilled in the art from the following description.

In an aspect of the embodiments of the inventive concept, a substrate treating apparatus comprises: a treating vessel including an outer cup and an inner cup placed in an inner side of the outer cup, the inner cup and the outer cup in combination defining a recollecting route for a recollecting a liquid; a rotatable spin head placed within the treating vessel on which a cleaning jig is placed; wherein the treating vessel comprises a first protrusion protruding from an inner side surface of the outer cup to direct a cleaning liquid scattering from the cleaning jig toward a surface of the inner cup.

In an embodiment, the first protrusion may be formed to protrude such that the cleaning liquid scattering from the cleaning jig collides with the first protrusion.

In an embodiment, the outer cup may comprise a vertical wall, and an inclined wall inclined inwardly and upwardly from a top of the vertical wall, wherein the first protrusion is provided in an inner surface of the inclined wall.

In an embodiment, the outer cup may further comprise a second protrusion protruding to the inner cup from the inner surface of the inclined wall and placed apart from the first protrusion closer to the inside.

In an embodiment, the second protrusion may be placed outside an edge of the cleaning jig.

In an embodiment, the first protrusion and the second protrusion may be provided in an annular ring shape at the inclined wall.

In an embodiment, the outer cup may comprise a first concave portion between the vertical wall and the first protrusion; and a second concave portion between the first protrusion and the second protrusion.

In an embodiment, the inner cup may comprise a dimple for recollecting cleaning liquid at the upper surface thereof.

In an embodiment, the inner cup may comprise an inner inclined wall inclining upwardly away from the spin head and below the cleaning jig, and an outer inclined wall connected to the inner inclined wall and inclining downwardly away from the spin head, the outer inclined wall and the outer cup in combination defining the recollecting route, In an embodiment, the dimple may be provided at an upper surface of the outer inclined wall.

In an embodiment, the cleaning liquid may comprise a thinner.

In another aspect of embodiments of the inventive concept, a treating vessel may be provided to surround the spin head comprising: an outer cup including a vertical wall and an inclined wall inclined inwardly and upwardly from a top of the vertical wall; and an inner cup placed in an inner side of the outer cup, the inner cup and the outer cup on combination defining a recollecting route for recollecting a liquid, wherein the outer cup comprises a first protrusion protruding from an inner surface of the inclined wall to the inner cup.

In an embodiment, the protrusion may be provided lower than the substrate placed on the spin head.

In an embodiment, the outer cup may further comprise a second protrusion protruding to the inner cup from the inner surface of the inclined wall and placed apart from the first protrusion.

In an embodiment, the second protrusion may be provided at a position away from the substrate placed on the spin head.

In an embodiment, the first protrusion and the second protrusion may be provided in an annular ring shape at the inclined wall.

In an embodiment, the outer cup may comprise a first concave portion between the vertical wall and the first protrusion, and a second concave portion between the first protrusion and the second protrusion.

In an embodiment, the inner cup may comprise an inner inclined wall inclining upwardly away from the spin head and below the cleaning jig, and an outer inclined wall connected to the inner inclined wall and inclining downwardly away from the spin head, the outer inclined wall and the outer cup in combination defining the recollecting route, wherein the outer inclined wall comprises a dimple for recollecting cleaning liquid at the upper surface thereof.

In an embodiment, the dimple may be formed to be aligned with a space between the first protrusion and the second protrusion.

In still another aspect of the embodiments of the inventive concept, a liquid processing apparatus may comprise: a treating vessel including an outer cup and an inner cup placed in an inner side of the outer cup, the inner cup and the outer cup in combination defining a recollecting route for recollecting a liquid; a rotatable spin head placed within the treating vessel on which a cleaning jig is placed; and a cleaning liquid nozzle which sprays a cleaning liquid to the top surface of the cleaning jig to clean the treating vessel, wherein the outer cup comprises: a perpendicular vertical wall; and an inclined wall inclining inwardly and upwardly from a top of the vertical wall, with a first protrusion colliding with the cleaning liquid scattered from the cleaning jig to direct a cleaning liquid toward a surface of the inner cup.

In an embodiment, the outer cup may comprise a second protrusion protruding to the inner cup from an inner surface of the inclined wall and placed apart from the first protrusion; a first concave portion between the vertical wall and the first protrusion; and a second concave portion between the first protrusion and the second protrusion.

In an embodiment, the inner cup may comprise a inner inclined wall inclining upwardly away from the spin head and below the cleaning jig; and a outer inclined wall connected to the inner inclined wall and inclining downwardly away from the spin head, the outer inclined wall and the outer cup in combination defining the recollecting route, wherein the outer inclined wall comprises a dimple at an upper surface aligned with a space between the first protrusion and the second protrusion, the dimple recollecting cleaning liquid falling to the outer inclined wall.

In an embodiment of the inventive concept, cleaning a cleaning liquid remaining on a treating vessel may become easy.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

The equipment of an embodiment of the inventive concept may be used to perform photolithography processes on substrates, such as semiconductor wafers or flat panel displays. Especially the equipment of an embodiment of the inventive concept may connect with an exposing apparatus to perform a coating process and a developing process on the substrate. As an exemplary only, embodiments of the inventive concept will be described below in a case of semiconductor wafer substrates FIG. 2 to FIG. 8 illustrate a substrate treating apparatus 1 according to an embodiment of the inventive concept.

Figure 2:
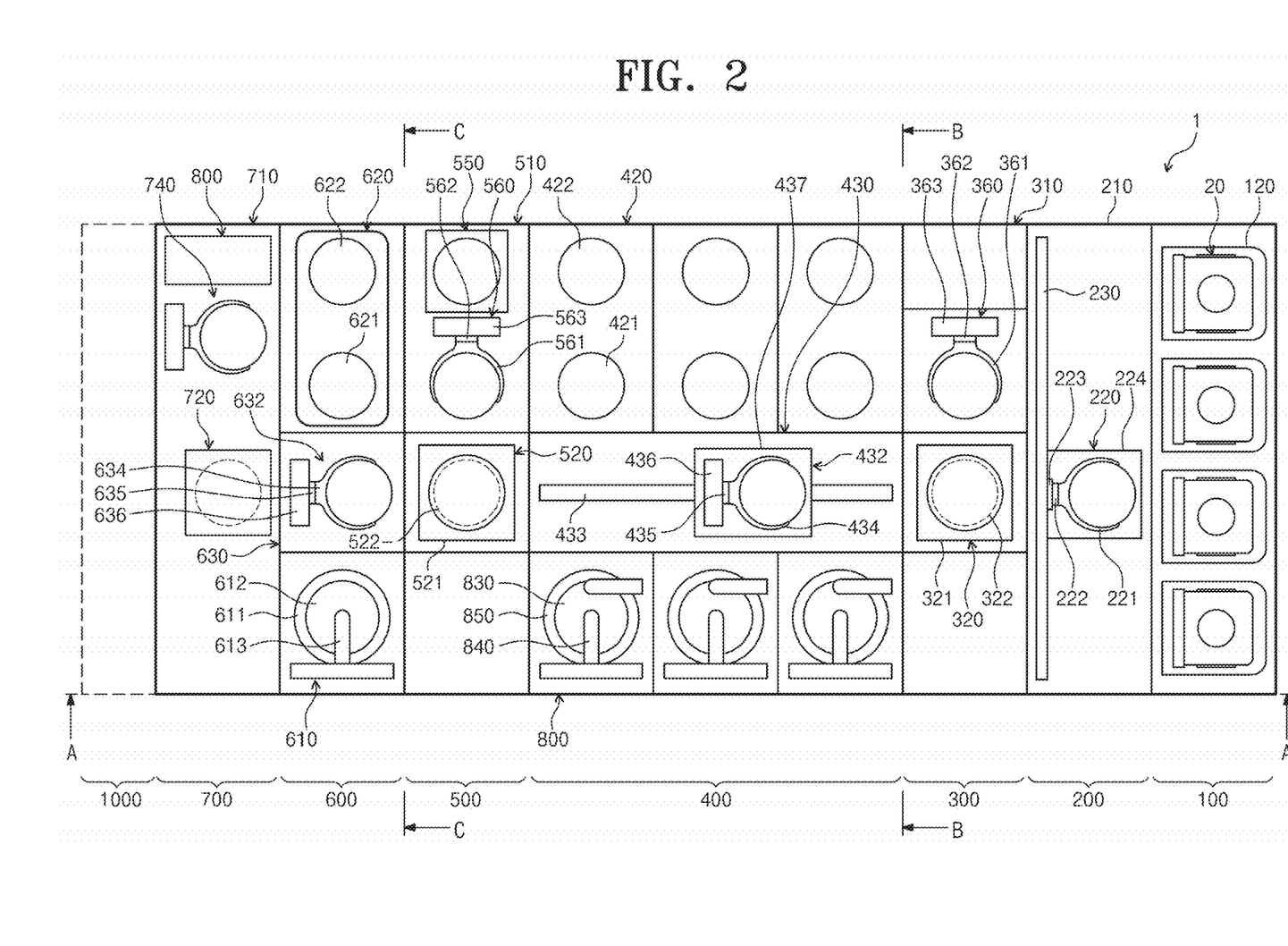
FIG. 2 is a top plan view of a substrate processing equipment in a first embodiment of the inventive concept.
Figure 3:
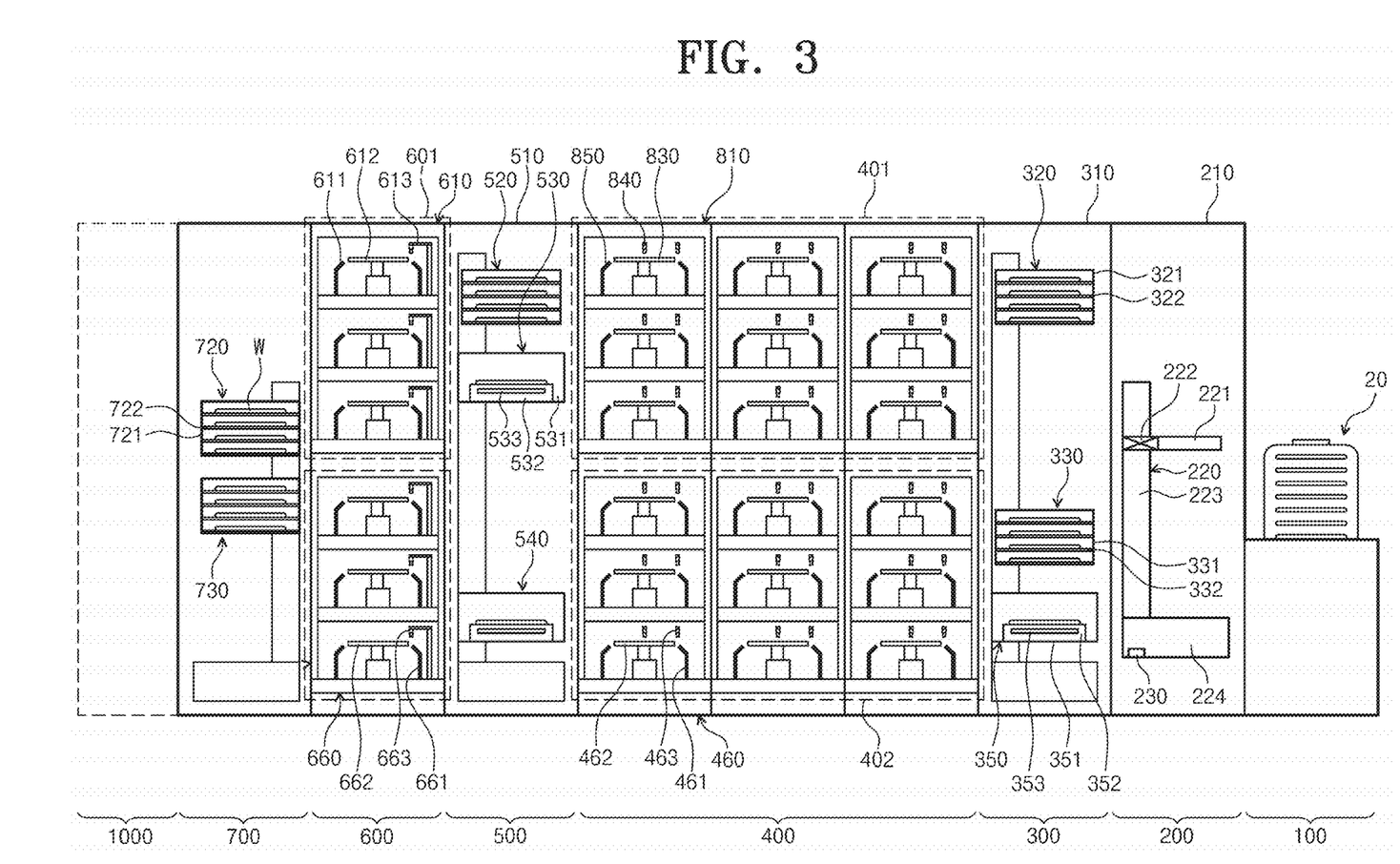
FIG. 3 is a cross sectional view of direction A-A of the equipment of FIG. 2.
Figure 4:
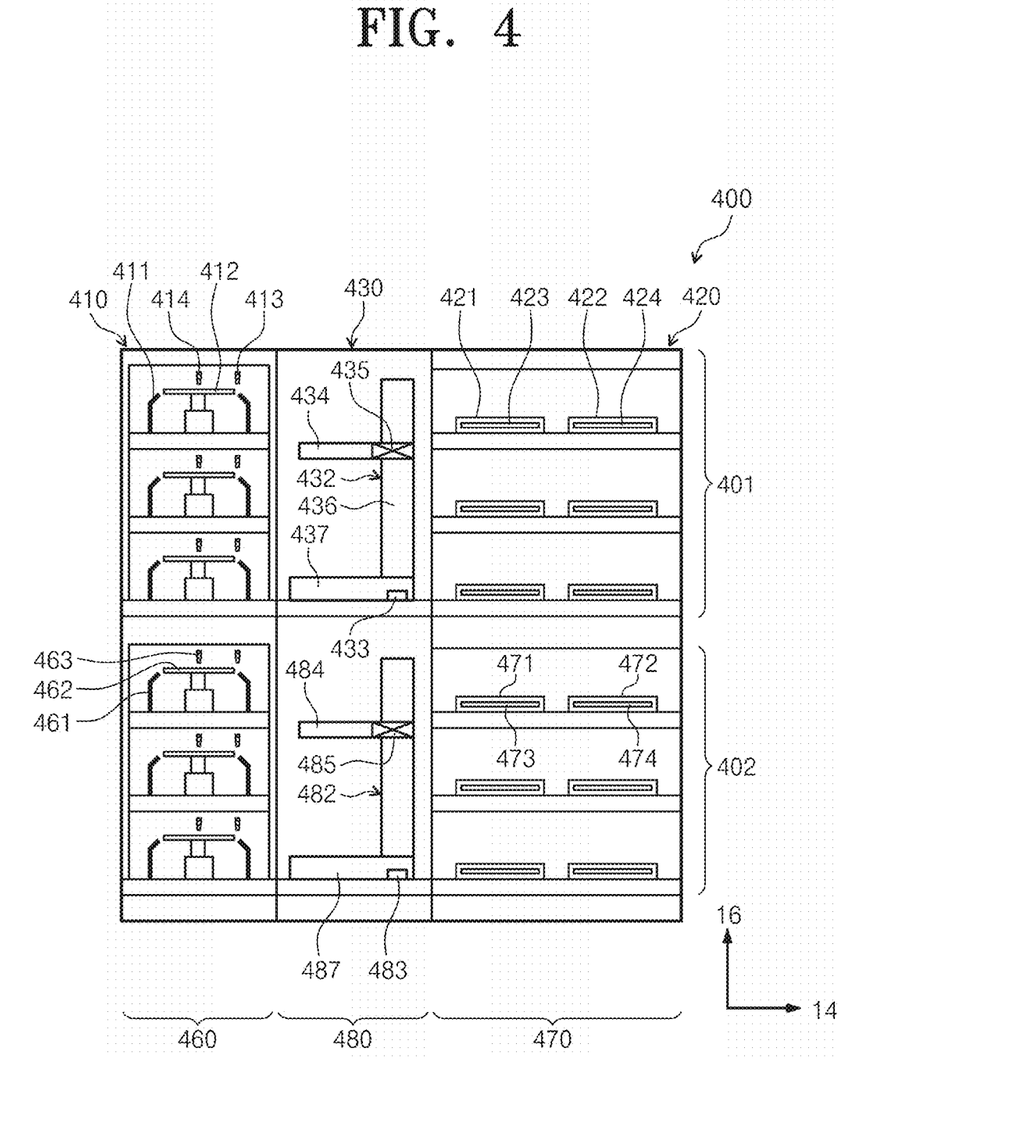
FIG. 4 is a cross sectional view of direction B-B of the equipment of FIG. 2.
Figure 5:
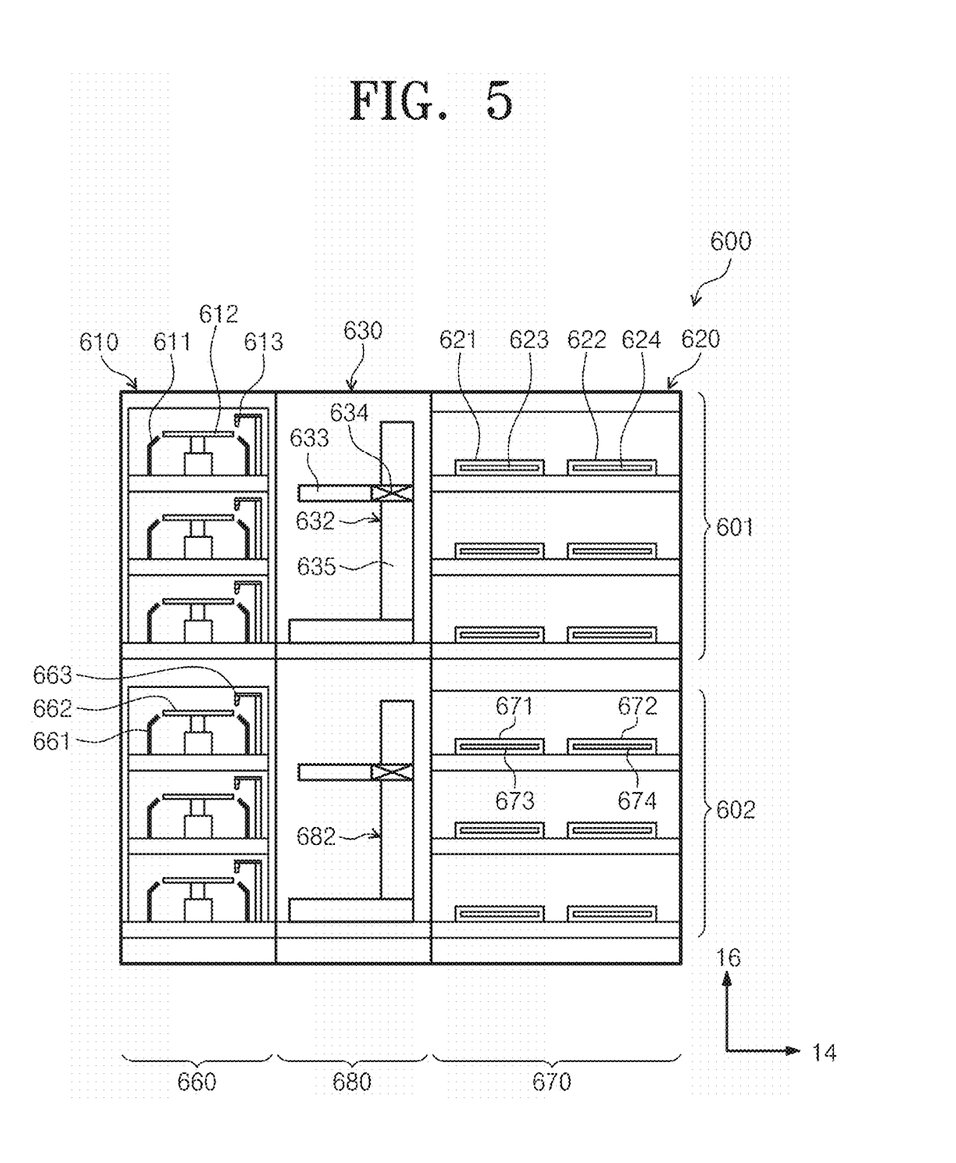
FIG. 5 is a cross sectional view of direction C-C of the equipment of FIG. 2.

FIG. 2 is a view from above of the substrate treating apparatus 1, FIG. 3 is a view from direction A-A of the substrate treating apparatus 1 in FIG. 2, FIG. 4 is a view from direction B-B of the substrate treating apparatus 1 in FIG. 2, and FIG. 5 is a view from direction C-C of the substrate treating apparatus 1 in FIG. 2.

Referring to FIG. 2 to FIG. 5, the substrate treating apparatus 1 includes a load port 100, an index model 200, a first buffer module 300, a coating and developing module 400, a second buffer module 500, a processing module for processing before and after exposing 600, and an interface module 700. The load port 100, the index module 200, the first buffer module 300, the coating and developing module 400, the second buffer module 500, and the processing module for processing before and after exposing 600, and the interface module 700 are sequentially arranged in a row.

Hereinafter, a direction in which the load port 100, the index module 200, the first buffer module 300, the coating and developing module 400, the second buffer module 500, the processing module for processing before and after exposing 600, and the interface module 700 are arranged will be referred to as a first direction 12. A direction that is perpendicular to the first direction 12 when viewed from above will be referred to as a second direction 14, and a direction that is perpendicular to both the first direction 12 and the second direction 14 will be referred to as a third direction 16.

Being stored in a cassette 20, the substrate W is transferred. The cassette 20 has a structure that can be sealed off from the outside. For example, a front open unified pod (FOUP) with a complete open door may be used for the cassette 20.

Hereinafter, the load port 100, the index module 200, the first buffer module 300, the coating and developing module 400, the second buffer module 500, the processing module for processing before and after exposing 600, and the interface module 700 will be explained.

The load port 100 has a placement stage 120 on which 20 the cassette storing substrates W is placed. The placement stage 120 is provided in a plurality, and the placement stages 120 are arranged in the second direction 14 in a row. In an embodiment shown in FIG. 2, four placement stages 120 are provided.

The index module 200 transfers the substrate W between the cassette 20 placed on the placement stage 120 of the load port 100, and the first buffer module 300. The index module 200 includes a frame 210, an index robot 200, and a guide rail 230. The frame 210 is generally provided in the shape of an empty rectangular parallelepiped. The frame 210 is arranged between the load port 100 and the first buffer module 300. The frame 210 of the index module 200 may be provided in a height lower than the frame 310 of the first buffer module 300 which will be explained further on. An index robot 220 and a guide rail 230 are provided inside the frame 210. The index robot 220 has a hand 221 which directly handles the substrate W and is a multi-axes driven structure movable in the first direction 12, the second direction 14, and the third direction 16, and rotatable. The index robot 220 includes a hand 221, an arm 222, a support 223, and a base 224. The hand 221 is fixedly installed to the arm 222. The arm 222 is provided in a structure that may be expandable and contractable, and rotatable. The support 223 is arranged with its length extending along in the third direction 16. The arm 222 is connected to and movable on the support 223. The support 223 is fixedly connected to the base 224. The guide rail 230 is arranged with its length extending along the second direction 14. The base 224 is connected to the guide rail 230 and linearly movable on the guide rail 230. Also, although not shown, a door opener which opens and closes the door of the cassette 20 is provided in the frame 210.

The first buffer module 300 includes a frame 310, a first buffer 320, a second buffer 330, a cooling chamber 350, and a first buffer robot 360. The frame 310 is provided in the shape of an empty rectangular parallelepiped, and is arranged between the index module 200 and the coating and developing module 400. The first buffer 320, the second buffer 330, the cooling chamber 350, and the first buffer robot 360 are provided within the frame 310. The cooling chamber 350, the second buffer 330, and the first buffer 320 are arranged sequentially from bottom in the third direction 16. The first buffer 320 is provided at the same height as the coating module 401 of the coating and developing module 400, which will be described in the following. The second buffer 330 and cooling chamber 350 are provided at the same height as the developing module 402 of the coating and developing module 400, which will be described in the following. The first buffer robot 360 is placed apart from the second buffer 330, the cooling chamber 350, and the first buffer 320 in the second direction 14.

The first buffer 320 and the second buffer 330 temporarily store a plurality of substrates W. The second buffer 330 has a housing 331 and a plurality of supports 332. The supports 332 are arranged within the housing 331, and are placed apart from one another in the third direction 16. A single substrate W is placed on each of the supports 332. The housing 331 has openings (not shown) facing the index robot 220, the first buffer robot 360, and a developing robot 482 such that the index robot 220, the first buffer robot 360, and the developing robot 482 of a developing module 402 which will be explained further can bring substrates W into/out of the housing 331 on the supports 332. The first buffer 320 generally has a similar structure to the second buffer 330, i.e., the housing 321 of the first buffer 320 has openings facing the first robot 360 and a coating robot 432 provided in the coating module 401 for transferring wafer W therebetween. The number of supports 322 provided in the first buffer 320 and the number of supports 332 provided in the second buffer 330 may be the same or different. In an embodiment, the number of supports 332 provided in the second buffer 330 may be greater than the number of supports 332 provided in the first buffer 320.

The first buffer robot 360 transfers the substrate W between the first buffer 320 and the second buffer 330. The first buffer robot 360 includes a hand 361, an arm 362, and a support 363. The hand 361 is fixedly installed to the arm 362. The arm 362 is provided in a structure which can be expandable and contractable, such that the hand can move in the second direction 14. The arm 362 is movably connected to the support 363 and the arm linearly moves on the support 363 in the third direction. The support 363 has a length extending between the point corresponding to the position of the second buffer 330 and the point corresponding to the position of the first buffer 320. The support 363 may extend further upwardly or downwardly. The first robot 360 can be provided as a two-axes driven structure such that the hand 361 moves in the second direction 14 and the third direction 16.

The cooling chamber 350 cools each of the substrates W. The cooling chamber 350 includes a housing 351 and a cooling plate 352. The cooling plate 352 includes a top surface on which the substrate W is placed and a cooling member 350 for cooling the substrates W. The cooling member 353 may utilize various cooling methods such as using cooling water or thermoelectric devices. The cooling chamber 350 may be further provided with a lift pin assembly (not shown), which places a substrate W on the cooling plate 352. The housing 351 may have openings (not shown) facing the index robot 220 and the developing robot 482 for the index robot 200 and the developing robot 482 to bring substrates W into/out of the cooling plate 352. Further, the cooling chamber 350 is provided with doors which open and closes aforementioned openings.

The coating and developing module 400 performs processes such as applying photosensitive solution on the substrate W before the exposing process, and developing the substrate W after the exposing process. The coating and developing module 400 generally has a rectangular parallelepiped shape. The coating and developing module 400 has a coating module 401 and a developing module 402. The coating module 401 and the developing module 402 are arranged to be divided on different floors. In an embodiment, the coating module 401 can be provided above the developing module 402.

The coating module 401 performs processes such as applying photosensitive solution for example photoresist solution on the substrate W and heat treatment processes such as heating and cooling substrate W before and after photoresist coating processes. The coating module 401 has a photoresist coating chamber 410, a baking chamber 420, and a transfer chamber 430. The photoresist coating chamber 410, the baking chamber 420, and the transfer chamber 430 are sequentially arranged in the second direction 14. Therefore photoresist coating chamber 410 and the baking chamber 420 are placed apart in the second direction with the transfer chamber 430 between them. The photoresist coating chamber 410 may be provided in a plurality, and a plurality may be provided in the first direction 12 and in third direction 16, respectively. In the figure, an example of six baking chambers 420 are provided. However, the baking chamber 420 can be provided in a larger number.

The transfer chamber 430 is arranged side by side with the first buffer 320 of the first buffer module 300 in the first direction 12. A coating robot 432 and a guide rail 433 are provided in the transfer chamber 430. The transfer chamber 430 usually has the shape of a rectangle. The coating robot 432 transfers the substrate W between the baking chambers 420, the photoresist coating chambers 410, the first buffer 320 of the first buffer module 300, and the first cooling chamber 520 of the second buffer module 500 which will be explained later. The guide rail 433 is arranged with its length extending along the first direction 12. The guide rail 433 guides the coating robot 432 to move linearly (i.e., move back and forth) in the first direction 12. The coating robot 432 has a hand 434, an arm 435, a support 436, and a base 437. The hand 434 is fixedly installed to the arm 435. The arm 435 is provided in a structure that may be expandable and contractable such that the hand 434 may move horizontally. The support 436 is arranged with its length extending along the third direction 16. The arm is connected to the support 436 such that it may linearly move on the support 436 in the third direction 16. The support 436 is fixedly installed to the base 437, and base 437 is connected to the guide rail 433 so as to be movable along the guide rail 433.

The photoresist coating chambers 410 have the same structure. However, photoresists used in each photoresist coating chamber 410 may be different. In an embodiment, chemical amplification resist can be used as photoresist. The photoresist coating chamber 410 applies photoresists onto the surface of the substrate W. A liquid coating process is performed on the substrate treating apparatus 800, and this will be further explained referring to FIG. 6 to FIG. 7.

Referring back to FIG. 2 to FIG. 5, the baking chamber 420 heat-treats the substrate W. For example, the baking chambers 420 may perform processes such as a pre-bake process of heating the substrate W to a predetermined temperature before applying the photoresist to remove organic materials or moisture from the surface of the substrate W, or a soft-bake process performed after applying photoresist to the substrate W, after which a cooling process of cooling the substrate W may be performed. The baking chamber 420 has a cooling plate 421 or a heating plate 422. The cooling plate 421 is provided with a cooling means 423 such as cooling water or a thermoelectric device. In addition, the heating plate 422 is provided with a heating means 424 such as a hot wire or a thermoelectric device. The cooling plate 421 and the heating plate 422 may be provided in one baking chamber 420. Alternatively, some of the baking chambers 420 may include only a cooling plate 421 and some others may include only a heating plate 422.

The developing module 402 includes a developing process of removing a part of the photoresist by supplying a developing solution to obtain a pattern on the substrate W, and a heat treatment process such as heating and cooling performed on the substrate W before and after the developing process. The developing module 402 has a developing chamber 460, a baking chamber 470, and a transfer chamber 480. The developing chamber 460, the baking chamber 470, and the transfer chamber 480 are sequentially disposed along the second direction 14. Accordingly, the developing chamber 460 and the baking chamber 470 are positioned to be placed apart from each other in the second direction 14 with the transfer chamber 480 interposed therebetween. A plurality of developing chambers 460 are provided, and the plurality of developing chambers 460 are provided in the first direction 12 and the third direction 16, respectively. In the drawing, an example in which six developing chambers 460 are provided is illustrated. A plurality of baking chambers 470 are provided in the first direction 12 and the third direction 16, respectively. In the drawing, an example in which six baking chambers 470 are provided is illustrated. However, unlike this, the baking chamber 470 may be provided in a larger number.

The transfer chamber 480 is placed side by side with the second buffer 330 of the first buffer module 300 in the first direction 12. Inside the transfer chamber 480 there is the developing robot 482 and the guide rail 483. The transfer chamber usually has the shape of a rectangle. The developing robot 482 moves the substrate W between the baking chambers 470, the developing chambers 460, the second buffer 330 of the first buffer module 300, the cooling chamber 350, and the second cooling chamber 540 of the second buffer module 500. The length of the guide rail 483 is extending along the first direction 12. The guide rail 483 guides the developing robot 482 to move linearly in the first direction 12. The developing robot 482 has a hand 484, an arm 485, a support 486, and a base 487. The hand 484 is fixedly installed to the arm 485. The arm 485 is expandable and contractable so the hand 484 moves horizontally. The length of support 486 is extending along the third direction 16. The arm 485 connects with the support 486 to move linearly in the third direction 16. The support 486 is fixedly installed to the base 487. The base 487 combines with the guard rail 483 so that it may move along the guard rail 483.

The developing chambers 460 all have the same structure. However, each of the developing liquids used in each of the developing chambers 460 may be different to one another. The developing chamber 460 may remove the light-irradiated portions of the photoresist applied on the surface of the substrate W. At this time, the light-irradiated portions of the protective layer may be removed, too. Depending on the kind of photoresist, the portions of the photoresist and protective layer that are not light-irradiated may be removed.

The developing chamber 460 has a vessel 461, a support plate 462, and a nozzle 463. The vessel 461 has a shape of a cup with an opened upper part. The support plate 462 is disposed in the vessel 461, and supports the substrate W. The support plate 462 is rotatably provided. The nozzle 463 provides the developing liquid onto the substrate W. The nozzle 463 has the shape of a circular tube, and can supply developing liquid onto the center of the substrate W. Alternatively, the nozzle may have a length which matches the diameter of the substrate W, and the outlet of the nozzle 463 may be a slit. Also, a nozzle 464 that supplies cleaning liquid such as deionized water may be additionally provided in the developing chamber 460 to clean the surface of the substrate W.

The baking chamber 470 heat-treats the substrate W. For example, the baking chambers 470 perform a post-baking process of heating the substrate W before the developing process is performed, a hard baking process of heating the substrate W after the developing process, and a cooling process of cooling the heated wafer after each baking process. The baking chamber 470 has a cooling plate 471 or a heating plate 472. The cooling plate 471 is provided with a cooling means 473 such as cooling water or a thermoelectric device. Alternatively, the heating plate 472 is provided with a heating means 474 such as a hot wire or a thermoelectric device. The cooling plate 471 and the heating plate 472 may be provided in one baking chamber 470, respectively. Alternatively, some of the baking chambers 470 may include only a cooling plate 471, and the other may include only a heating plate 472.

As aforementioned, the coating module 401 and the developing module 402 are provided so that they can be separated from each other in the coating and developing module 400. Also, when seen from above, the coating module 401 and the developing module 402 can have the same chamber arrangement.

The second buffer module 500 is provided as a passage through which the substrate W is transferred between the coating and developing module 400 and the processing module for processing before and after exposing 600. In addition, the second buffer module 500 performs a certain such as a cooling process or an edge exposing process on the substrate W. The second buffer module 500 includes a frame 510, a buffer 520, a first cooling chamber 530, a second cooling chamber 540, an edge exposing chamber 550, and a second buffer robot 560. The frame 510 has a rectangular parallelepiped shape. The buffer 520, the first cooling chamber 530, the second cooling chamber 540, the edge exposing chamber 550, and the second buffer robot 560 are placed in the frame 510. The buffer 520, the first cooling chamber 530, and the edge exposing chamber 550 are disposed at a height corresponding to the coating module 401. The second cooling chamber 540 is disposed at a height corresponding to the developing module 402. The buffer 520, the first cooling chamber 530, and the second cooling chamber 540 are sequentially arranged in a row along the third direction 16. When viewed from above, the buffer 520 is disposed along the first direction 12 with the transfer chamber 430 of the coating module 401. The edge exposing chamber 550 is disposed to be placed apart from the buffer 520 or the first cooling chamber 530 in the second direction 14.

The second buffer robot 560 transports the substrate W between the buffer 520, the first cooling chamber 530, and the edge exposing chamber 550. The second buffer robot 560 is placed between the edge exposing chamber 550 and the buffer 520. The second buffer robot 560 may be provided in a structure similar to that of the first buffer robot 360. The first cooling chamber 530 and the edge exposing chamber 550 perform a subsequent process on the wafers W on which a process is performed in the coating module 401. The first cooling chamber 530 cools the substrate W on which a process is performed in the coating module 401. The first cooling chamber 530 has a structure similar to the cooling chamber 350 of the first buffer module 300. The edge exposing chamber 550 exposes an edge of the wafers W on which the cooling process has been performed in the first cooling chamber 530. The buffer 520 temporarily stores the substrate W before the substrates W on which a process has performed in the edge exposing chamber 550 are transferred to a preprocessing module 601 which will be explained further. The second cooling chamber 540 cools the wafers W before the wafers W that have been processed in the postprocessing module 602 to be described later are transferred to the developing module 402. The second buffer module 500 may further comprise a buffer added to a height corresponding to the developing module 402. In this case, the wafers W on which a process is performed in the postprocessing module 602 may be temporarily stored in the added buffer and then transported to the developing module 402.

When the exposure device 1000 performs an immersion exposure process, processing module for processing before and after exposing 600 may apply a protective layer protecting a photoresist film applied to the substrate W during immersion exposure. In addition, the processing module for processing before and after exposing 600 may perform a process of cleaning the substrate W after exposure. In addition, when the application process is performed using a chemical amplification resist, the processing module for processing before and after exposing 600 may process the post-exposure baking process.

The processing module for processing before and after exposing 600 include a preprocessing module 601 and a postprocessing module 602. The preprocessing module 601 performs a process of treating the substrate W before performing the exposing process, and the postprocessing module 602 performs a process of treating the substrate W after the exposing process. The preprocessing module 601 and the postprocessing module 602 are disposed to be divided into layers. In an embodiment, the preprocessing module 601 is placed above the postprocessing module 602. The preprocessing module 601 is provided at the same height as the coating module 401. The postprocessing module 602 is provided at the same height as the developing module 402. The preprocessing module 601 includes a protective layer coating chamber 610, a baking chamber 620, and a transfer chamber 630. The protective layer coating chamber 610, the transfer chamber 630, and the baking chamber 620 are sequentially disposed along the second direction 14. Accordingly, the protective layer coating chamber 610 and the baking chamber 620 are placed apart from each other in the second direction 14 with the transfer chamber 630 interposed therebetween. A plurality of protective layer coating chambers 610 are provided and are disposed along the third direction 16 to form layers. Alternatively, a plurality of protective layer coating chambers 610 may be provided in the first direction 12 and the third direction 16, respectively. A plurality of baking chambers 620 are provided and are disposed along the third direction 16 to form layers. Alternatively, a plurality of baking chambers 620 may be provided in the first direction 12 and the third direction 16, respectively.

The transfer chamber 630 is placed side by side with the first cooling chamber 530 of the second buffer module 500 in the first direction 12. Inside the transfer chamber 630 there is the preprocessing robot 632. The transfer chamber 630 usually has the shape of a square or a rectangle. The preprocessing robot 632 moves the substrate W between the protective layer coating chambers 610, the baking chambers 620, the buffer 520 of the second buffer module 500, and the first buffer of the interface chamber 700 which will be explained further. The preprocessing robot 632 has a hand 633, an arm 634, and a support 632. The hand 633 is fixedly installed to the arm 634. The arm 634 is expandable and contractable, and rotatable. The arm 634 connects with the support 635 to move linearly in the third direction 16.

The protective layer coating chamber 610 applies photoresist onto the surface of the substrate W. The protective layer coating chamber 610 has a housing 611, a support plate 612, and a nozzle 613. The housing 611 has the shape of a cup with an opened upper side. The support plate 612 is provided inside the housing 611, and supports the substrate W. The support plate 612 is provided to be rotatable. The nozzle 613 provides photoresist onto the surface of the substrate W disposed on the support plate 612. The nozzle 613 has a circular tube shape and can provide photoresist onto the center of the substrate W. Alternatively the nozzle 613 may have a length corresponding to the diameter of the substrate W, and the outlet of the nozzle 413 may be provided in a slit. In this case, the support plate 612 may be fixedly provided. The photoresist includes a material with foaminess. A photoresistor or material with hydrophobicity can be used. In an embodiment, the photoresist can include a fluoride-based solvent. The protective layer coating chamber 610 rotates the substrate W placed on the support plate 612 and supplies photoresist to the central area of the substrate W.

The baking chamber 620 heat-treats the substrate W coated with the protective layer. The baking chamber 620 has a cooling plate 621 or a heating plate 622. The cooling plate 621 is provided with a cooling means 623 such as cooling water or a thermoelectric device. Alternatively, the heating plate 622 is provided with a heating means 624 such as a hot wire or a thermoelectric device. The heating plate 622 and the cooling plate 621 may each be provided in one baking chamber 620. Alternatively, some of the baking chambers 620 may include only a heating plate 622, and the other may include only a cooling plate 621.

The postprocessing module 602 includes a cleaning chamber 660, a post-exposing baking chamber 670, and a transfer chamber 680. The cleaning chamber 660, the transfer chamber 680 and the post-exposing baking chamber 670 are sequentially disposed along the second direction 14. Accordingly, the cleaning chamber 660 and the post-exposing baking chamber 670 are positioned to be placed apart from each other in the second direction 14 with the transfer chamber 680 interposed therebetween. A plurality of cleaning chambers 660 are provided and may be disposed along the third direction 16 to form layers. Alternatively, a plurality of cleaning chambers 660 may be provided in the first direction 12 and the third direction, respectively. A plurality of post-exposing baking chambers 670 are provided, and may be disposed along the third direction 16 to form layers. Alternatively, a plurality of post-exposing baking chambers 670 may be provided in the first direction 12 and the third direction 16, respectively.

The transfer chamber 680 is positioned parallel to the second cooling chamber 540 of the second buffer module 500 in the first direction 12 when viewed from above. The transfer chamber 680 has a substantially square or rectangular shape. The postprocessing robot 682 is placed in the transfer chamber 680. The postprocessing robot 682 transports the substrate W between the cleaning chambers 660, the post-exposing baking chambers 670, the second cooling chamber 540 of the second buffer module 500, and a second buffer 730 of the interface module 700 to be described later. The postprocessing robot 682 provided to the postprocessing module 602 may be provided in the same structure as the preprocessing robot 632 provided to the preprocessing module 601.

The cleaning chamber 660 cleans the substrate W after the exposing process. The cleaning chamber 660 has a housing 661, a support plate 662, and a nozzle 663. The housing 661 has a cup shape with an open top. The support plate 662 is placed in the housing 661 and supports the substrate W. The support plate 662 is provided to be rotatable. The nozzle 663 supplies a cleaning liquid onto the substrate W placed on the support plate 662. Water such as deionized water may be used as the cleaning liquid. The cleaning chamber 660 supplies the cleaning liquid to the central area of the substrate W while rotating the substrate W placed on the support plate 662. Alternatively, while the substrate W is rotated, the nozzle 663 may linearly move or rotate from the central area of the substrate W to the edge area.

The post-exposing baking chamber 670 heats the substrate W on which the exposing process is performed using atomic rays. In the post-exposing baking process, the substrate W is heated to amplify the acid generated in the photoresist by exposing to complete the change in the properties of the photoresist. After exposing, the baking chamber 670 has a heating plate 672. The heating plate 672 is provided with a heating means 674 such as a hot wire or a thermoelectric device. After exposing, the baking chamber 670 may further include a cooling plate 671 therein. The cooling plate 671 is provided with a cooling means 673 such as cooling water or a thermoelectric device. In addition, a baking chamber having only the cooling plate 671 may be further provided.

As described above, the preprocessing module 601 and the postprocessing module 602 in the processing module for processing before and after exposing 600 are provided to be completely separated from each other. In addition, the transfer chamber 630 of the preprocessing module 601 and the transfer chamber 680 of the postprocessing module 602 may be provided in the same size and may be provided to completely overlap each other when viewed from above. In addition, the protective layer coating chamber 610 and the cleaning chamber 660 may be provided in the same size and may be provided to completely overlap each other when viewed from above. In addition, the baking chamber 620 and the post-exposing baking chamber 670 may be provided in the same size so as to completely overlap each other when viewed from above.

The interface module 700 transfers the substrate W between the processing module for processing before and after exposing 600 and the exposing device 1000. The interface module 700 has a frame 710, a first buffer 720, a second buffer 730, and an interface robot 740. The first buffer 720, the second buffer 730, and the interface robot 740 are placed in the frame 710. The first buffer 720 and the second buffer 730 are placed apart from each other and are disposed to be stacked on each other. The first buffer 720 is disposed higher than the second buffer 730. The first buffer 720 is placed at a height corresponding to the preprocessing module 601, and the second buffer 730 is disposed at a height corresponding to the postprocessing module 602. When viewed from above, the first buffer 720 is arranged in a row with the transfer chamber 630 of the preprocessing module 601 in the first direction 12, and the second buffer 730 is arranged in a row with the transfer chamber 630 of the postprocessing module 602.

The interface robot 740 is placed apart from the first buffer 720 and the second buffer 730 in the second direction 14. The interface robot 740 transports the substrate W between the first buffer 720, the second buffer 730, and the exposing device 1000. The interface robot 740 has a structure substantially similar to that of the second buffer robot 560.

The first buffer 720 temporarily stores the substrates W processed at the preprocessing module 601 before they are moved to the exposing apparatus 1000. Also, the second buffer 730 temporarily stores the substrates W which have been processed in the exposing apparatus 1000 before they are moved to the postprocessing apparatus 602 for further processing. The first buffer 720 has a housing 721 and a plurality of supports 722. The supports 722 are provided within the housing 721 and are placed apart from each other in the third direction. One substrate W is placed on each support 772. The housing 721 has openings facing the interface robot 740 and the preprocessing robot 632, so that the interface robot 740 and the preprocessing robot may bring substrates W into or out of the housing 721 through the openings and then onto or out of the support 722. The second buffer 730 has a structure similar to that of the first buffer 720 for transferring the substrate W. However, the housing 4531 of the second buffer 730 has an opening (not shown) in the direction in which the interface robot 740 is provided and the direction in which the post-processing robot 682 is provided. Only buffers and robots may be provided to the interface module as described above without providing a chamber that performs a certain process on the wafer.

The resist coating chamber 410 may be provided as a substrate processing apparatus for applying a photoresist onto the substrate W described below.

Figure 6:
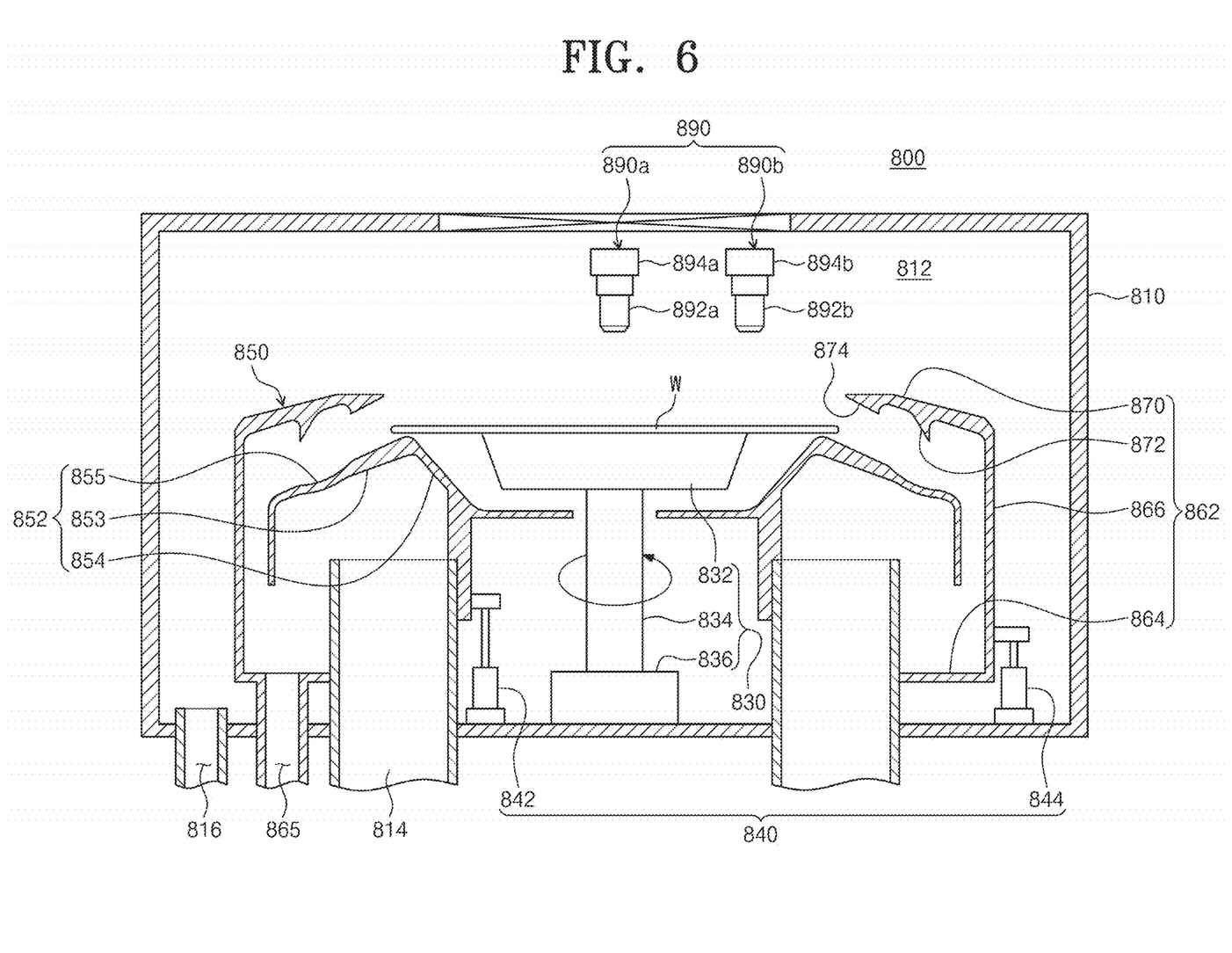
FIG. 6 is a cross sectional view of the substrate processing equipment of FIG. 2.

FIG. 6 is a cross-sectional view illustrating the substrate processing apparatus of FIG. 2.

Referring to FIG. 6, the substrate processing apparatus 800 is an apparatus for applying a photoresist onto the substrate W. The substrate processing apparatus 800 may include a housing 810, a substrate supporting unit 830, a treating vessel 850, a lifting and lowering unit 840, a liquid supply unit 890 and a controller 880.

The housing 810 is provided in a rectangular cylindrical shape having a processing space 812 therein. An opening (not shown) is formed on one side of the housing 810. The opening functions as an inlet through which the substrate W is carried out. A door is installed in the opening, and the door opens and closes the opening. When the substrate processing process proceeds, the door closes the opening to seal the processing space 812 of the housing 810. An inner exhaust port 814 and an outer exhaust port 816 are formed on the lower surface of the housing 810. The airflow formed in the housing 810 is exhausted to the outside through the inner exhaust port 814 and the outer exhaust port 816. According to an example, the flow provided in the processing container 850 may be exhausted through the inner exhaust port 814, and the air flow provided outside the processing container 850 may be exhausted through the outer exhaust port 816.

The substrate support unit 830 supports the substrate W in the processing space 812 of the housing 810. The substrate support unit 830 rotates the substrate W. The substrate support unit 830 includes a spin head 832, a rotary shaft 834, and a driver 836. The spin head 832 is provided as a substrate support member 832 supporting the substrate. The spin head 832 is provided to have a circular plate shape. The substrate W is in contact with the upper surface of the spin head 832. The spin head 832 is provided to have a diameter smaller than that of the substrate W. In an embodiment, the spin head 832 may vacuum-absorb the substrate W and chuck the substrate W. Alternatively, the spin head 832 may be provided as an electrostatic chuck for chucking the substrate W using static electricity. In addition, the spin head 832 may chuck the substrate W with a physical force.

Meanwhile, a cleaning jig 900 (shown in FIG. 8) may be seated on the spin head 832 during a cleaning process of the treating vessel 850. The rotary shaft 834 and the driver 836 are provided as rotary driving members 834 and 836 that rotate the spin head 832. The rotary shaft 834 supports the spin head 832 under the spin head 832. The rotary shaft 834 extends vertically. The rotary shaft 834 is provided to be rotatable around its central axis. The driver 836 provides a driving force such that the rotary shaft 834 rotates. For example, the driver 836 may be a motor capable of varying the rotational speed of the rotary shaft. The rotary driving members 834 and 836 may rotate the spin head 832 at a different rotational speed according to a substrate processing step.

The treating vessel 850 provides a processing space 812 in which a coating process is performed. The treating vessel 850 is provided to surround the substrate support unit 830. The treating vessel 850 is provided to have a cup shape with an open top. The treating vessel 850 includes an inner cup 852 and an outer cup 862.

The inner cup 852 is provided in a circular cup shape surrounding the rotary shaft 834. When viewed from above, the inner cup 852 is positioned to overlap with the inner exhaust port 814. When viewed from above, the upper surface of the inner cup 852 is provided such that the outer region of the inner cup 852 and the inner region of the inner cup 852 are inclined at different angles from each other. In an embodiment, an outer inclined wall 853 corresponding to the outer region of the inner cup 852 may be downwardly inclined as it moves away from the substrate support unit 830, and an inner inclined wall 854 corresponding to the inner region of the inner cup 852 may be upwardly inclined as it moves away from the substrate support unit 830. A portion at which the outer region and the inner region of the inner cup 852 connect each other is substantially registered with an edge of the substrate W or is slightly inwardly offset from the edge of the substrate W. The outer inclined wall 853 of the inner cup 852 may be provided as a region through which the treatment liquid flows.

Meanwhile, a recessed portion, e.g., a dimple 855 in which the cleaning liquid is recollected may be provided on the upper surface of the outer inclined wall 853. In the process of cleaning the treatment container 850, the cleaning liquid is recollected in the dimple 855, and in the subsequent liquid treatment process, the photoresist liquid falling to the outer inclined wall 853 is prevented from curing by the cleaning liquid filled in the dimple. Therefore, when the treating vessel 850 is cleaned, it is possible to quickly clean the photoresist liquid on the outer inclined wall. The cleaning liquid used to clean the treating vessel may contain a thinner.

The outer cup 862 is provided to have a cup shape surrounding the substrate support unit 830 and the inner cup 852. The outer cup 862 may include a bottom wall 864, a sidewall 866, and an inclined wall 870. The bottom wall 864 is provided to have a circular plate shape having an opening at the center thereof. A recollecting line 865 is formed on the bottom wall 864. The recollecting line 865 recollects the treatment liquid supplied onto the substrate W. The treatment liquid recollected by the recollecting line 865 may be reused by an external liquid regeneration system. The sidewall 866 is provided to have a circular cylindrical shape surrounding the substrate support unit 830. The side wall 866 extends vertically from the side end of the bottom wall 864. The side wall 866 extends upward from the bottom wall 864.

The inclined wall 870 extends from the upper end of the sidewall 866 toward the inside of the outer cup 862. The inclined wall 870 is provided to be closer to the substrate support unit 830 as it goes upward, i.e., the inclined wall 870 is upwardly and inwardly inclined. The inclined wall 870 is provided to have a ring shape. The upper end of the inclined wall 870 is positioned higher than the substrate W supported by the substrate support unit 830.

Figure 7:
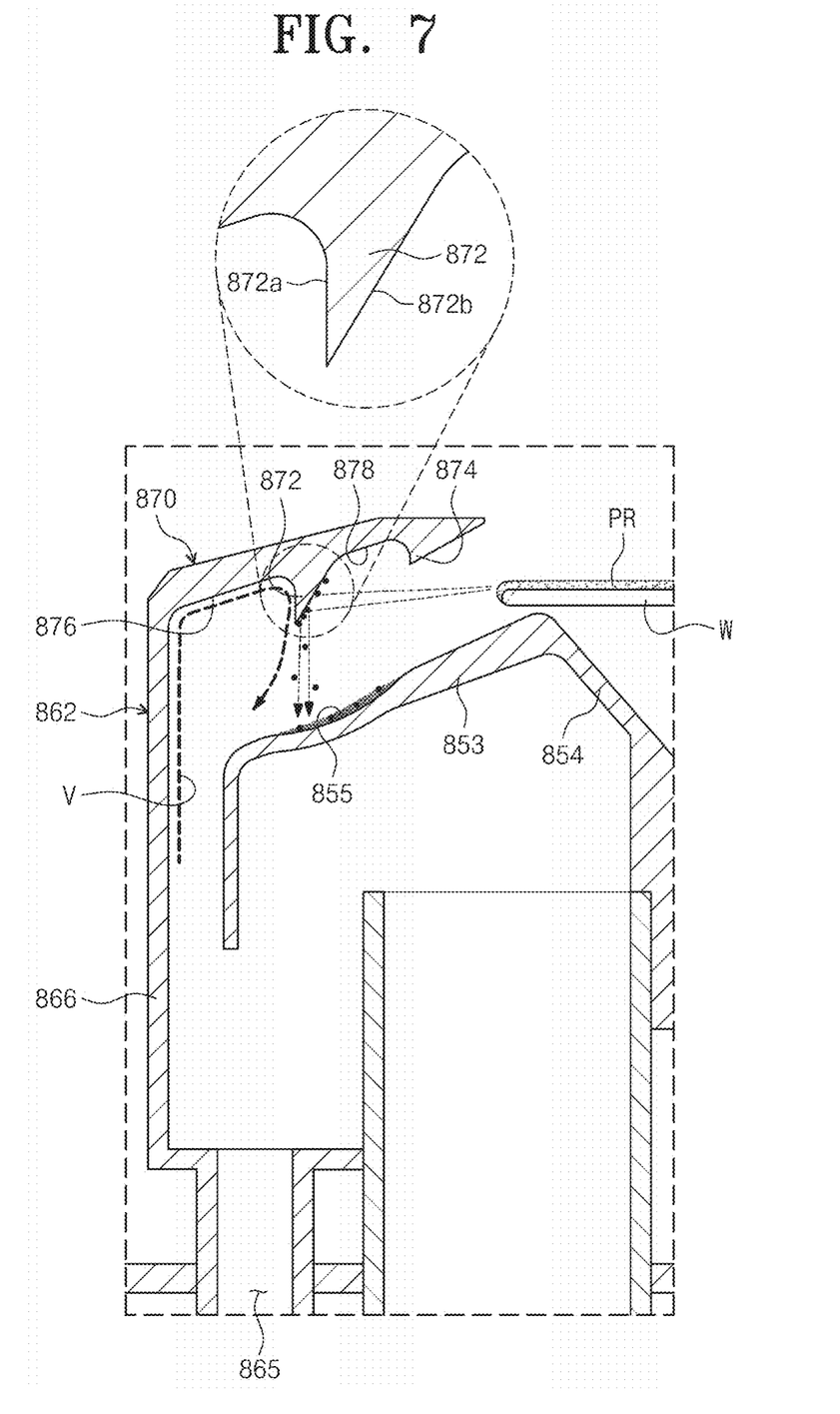
FIG. 7 and FIG. 8 are views illustrating a scattering of a processing liquid and a cleaning liquid at the treating vessel.

The inclined wall 870 has a first protrusion 872, a second protrusion 874, a first concave portion 876, and a second concave portion 878 (see FIG. 7).

The first protrusion 872 protrudes from the inner surface of the inclined wall 870. It is preferable that the first protrusion 872 protrudes such that the end of the first protrusion 872 is lower than the upper surface of the cleaning jig (or substrate), e.g., the first protrusion 872 protrudes downwardly beyond the upper surface of the jig. When cleaning the treating vessel 850, the cleaning liquid scattered from the cleaning jig 900 (shown in FIG. 8) collides with the first protrusion 872. The cleaning liquid colliding with the first protrusion 872 falls down to the upper surface (outer inclined wall) of the inner cup 852 to clean the surface of the inner cup 852, and partially flows along the second concave portion 878 to clean the surface of the inclined wall 870.

As illustrated in FIG. 7, the treatment liquid (e.g., photoresist liquid) scattered from the substrate during the liquid treatment process of the substrate collides with the inner surface 872b of the first protrusion 872. That is, the first protrusion 872 may prevent the treatment liquid from scattering to the outer side (e.g., to the side wall 866) of the outer cup 862 and causing contamination.

Figure 8:
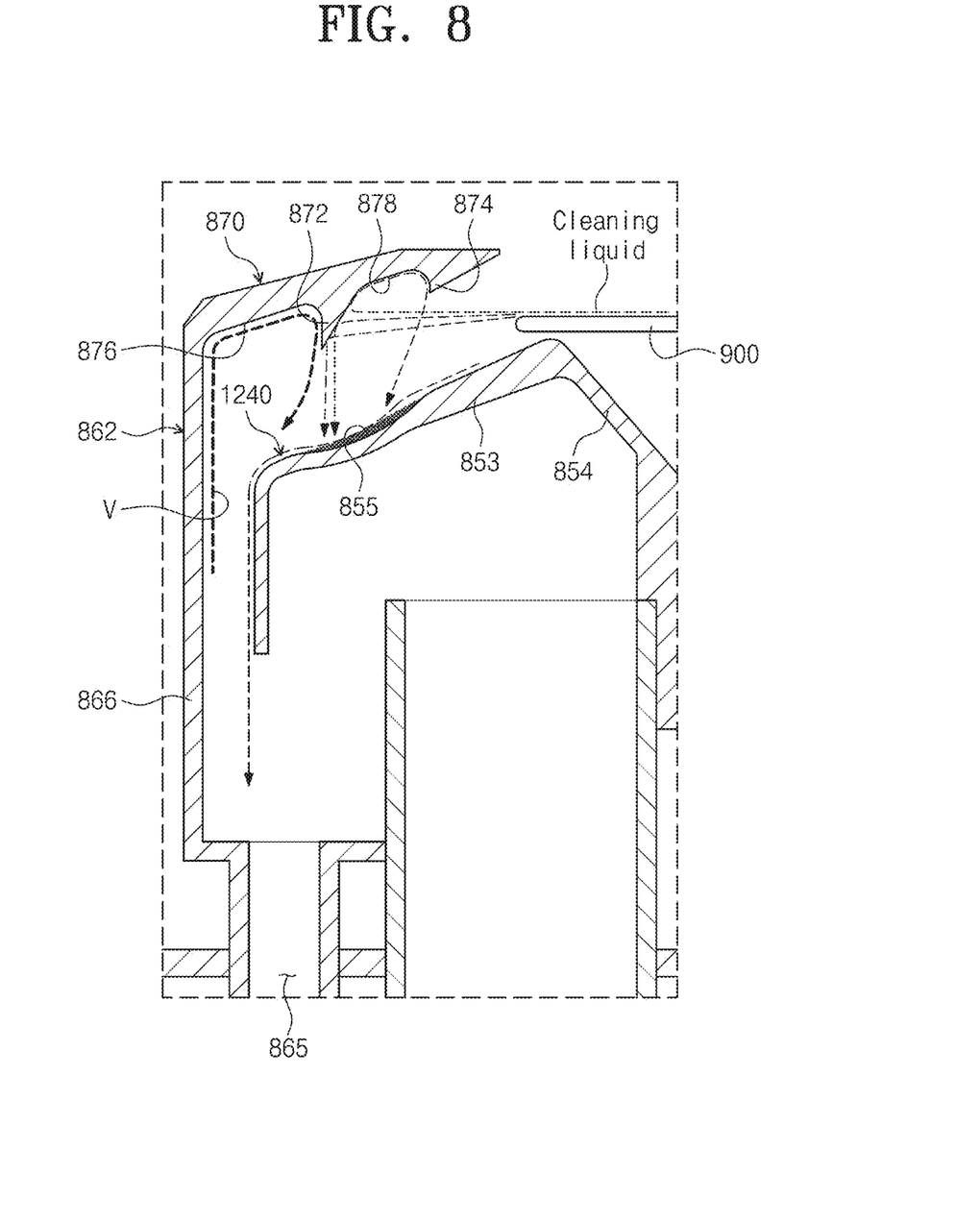

In addition, as shown in FIG. 8, the cleaning liquid scattered from the cleaning jig 900 hits the inner surface 872b of the first protrusion 872 during the cleaning process of the treating vessel 850. In addition, the first protrusion 872, for example, the outer surface 872a of the first protrusion 872 blocks the reverse flow (indicated by a dotted line in FIG. 7 and FIG. 8) generated in the recollecting path between the outer cup 862 and the inner cup 852.

The second protrusion 874 protrudes from the inner surface of the inclined wall 870 toward the inner cup 852. The second protrusion 874 may be formed to be placed apart from the first protrusion 872 and closer to the center of the treating vessel 850 than the first protrusion 872. The second protrusion 874 is formed at a position higher than the first protrusion 872. For example, the second protrusion 874 may protrude such that the end of the second protrusion 874 is higher than the upper surface of the jig (or substrate).

As shown in FIG. 7, the second protrusion 874 may be provided not to block or not to collide with the treatment liquid (e.g., photoresist liquid) scattered from the substrate during the liquid treatment process of the substrate. As shown in FIG. 8, the second protrusion 874 may be provided so as not to block or collide with the cleaning liquid scattered from the cleaning jig 900 during the cleaning process. However, as shown in FIG. 8, the second protrusion 874 blocks the cleaning liquid colliding with the inner surface 872b of the first protrusion 872 from heading to the substrate along the second concave portion 878.

The first concave portion 876 is formed on the inner surface of the inclined wall 870 between the first vertical wall 866 and the first protrusion 872. In the first concave portion 876, a vortex of the flow V flowing back in the recollecting path between the outer cup and the inner cup is formed, and the flow V flows back along the vertical wall 866 and the inclined wall 870, and then along the outer surface 872a of the first protrusion 872, heading towards the inner cup 852. That is, the first concave portion 876 and the first protrusion 872 block the flow V flowing back in the recollecting path between the outer cup 862 and the inner cup 852 from heading to the substrate.

The second concave portion 878 is formed between the first protrusion 872 and the second protrusion 874.

The lifting and lowering unit 840 lifts and moves the inner cup 852 and the outer cup 862, respectively. The lifting and lowering unit 840 includes an inner moving member 842 and an outer moving member 844. The inner moving member 842 moves the inner cup 852 vertically, and the outer moving member 844 moves the outer cup 862 vertically.

The liquid supply unit 890 may selectively supply various types of processing liquids onto the substrate W.

Referring FIG. 6, in an embodiment, the liquid supply unit 890 may include a first supply member 890a and a second supply member 890b for supplying a treatment liquid to the substrate W. The first supply member 890a and the second supply member 890b can respectively include nozzles 892a and 892b and nozzle moving members 894a and 894b. The first supply member 890a may supply a treatment liquid for a coating process onto the substrate. The second supply member 890b may supply a cleaning liquid for cleaning the treating vessel 850. The cleaning liquid may contain a thinner. The nozzle may be moved to a process position or a standby position by a nozzle moving member. Here, the process position is a position at which the nozzle faces the substrate W placed on the spin shuck 832 or the cleaning jig. The standby position is a position outside the process position. For example, the treatment liquid may be a photosensitive liquid such as a photoresist or a rinse liquid.

The effects of the inventive concept are not limited to the above-mentioned effects, and the unmentioned effects can be clearly understood by those skilled in the art to which the inventive concept pertains from the specification and the accompanying drawings. Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:

1. A substrate treating apparatus comprising:
a treating vessel including an outer cup and an inner cup, the inner cup being inside of the outer cup, an outer wall of the inner cup and an inner wall of the outer cup defining a recollecting passage configured to pass a cleaning liquid therethrough for recollecting the cleaning liquid;
a rotatable spin head placed within the treating vessel and configured to support a cleaning jig to be placed thereon; and
a nozzle configured to spray the cleaning liquid onto the cleaning jig placed on the rotatable spin head, wherein
the outer cup includes
    a bottom wall having a circular plate shape and having an opening at a center thereof,
    a side wall having a circular cylindrical shape and extending vertically from a side end of the bottom wall,
    an inclined wall extending from the side wall to be inclined inwardly and upwardly from a top of the side wall, and
    a first protrusion protruding downward from a central area of the inclined wall and configured to direct the cleaning liquid scattered from the cleaning jig toward the recollection passage,
    the bottom wall, the side wall and the inclined wall are provided integrally,
the inner cup comprises a dimple, the dimple being at the outer wall of the inner cup and configured to recollect the cleaning liquid at an upper surface of the inner cup, the dimple being vertically under and aligned with the first protrusion, and
the treating vessel is further configured to guide the cleaning liquid scattered from the cleaning jig to the recollection passage such that a portion of the cleaning liquid is deflected by the first protrusion and then is recollected in the dimple.

2. The substrate treating apparatus of claim 1, wherein the first protrusion is configured such that the cleaning liquid scattered from the cleaning jig collides with the first protrusion.

3. The substrate treating apparatus of claim 1, wherein
the outer cup further comprises a second protrusion, the second protrusion protruding from an inner surface of the inclined wall towards the inner cup, and the second protrusion being apart from the first protrusion and closer to a center of the treating vessel than the first protrusion, and
the second protrusion is outside an edge of the cleaning jig when viewed in a plan view.

4. The substrate treating apparatus of claim 3, wherein the inclined wall of the outer cup, which includes the first protrusion and the second protrusion, has an annular ring shape.

5. The substrate treating apparatus of claim 3, wherein the outer cup comprises:
a first concave portion between the side wall and the first protrusion; and
a second concave portion between the first protrusion and the second protrusion.

6. The substrate treating apparatus of claim 1, wherein the inner cup comprises:
an inner inclined wall inclining upwardly away from the rotatable spin head and below the rotatable spin head; and
an outer inclined wall connected to the inner inclined wall and inclining downwardly away from the rotatable spin head, the outer inclined wall and the outer cup defining the recollecting passage therebetween, and
an upper surface of the outer inclined wall includes the dimple.

7. The substrate treating apparatus of claim 3, wherein the dimple is aligned with a portion of the outer cup between the first protrusion and the second protrusion.

8. The substrate treating apparatus of claim 3, wherein the second protrusion is at a position higher that the first protrusion.

* * * * *